United States Statutory Invention Registration [19]

[11] Reg. Number: H663

Massopust [43] Published: Aug. 1, 1989

[54] HIGH DENSITY PROBE HEAD FOR CHIP TESTING

[76] Inventor: Dan Massopust, Rte. 3, Box 544, Menomonie, Wis. 54751

[21] Appl. No.: 143,511

[22] Filed: Jan. 13, 1988

[51] Int. Cl.[4] ..... G01R 1/06

[52] U.S. Cl. ..... 324/158 F

[58] Field of Search ..... 324/158 F, 158 P, 73 PC, 324/72.5

[56] References Cited

U.S. PATENT DOCUMENTS

| | | |
|---|---|---|
| 3,911,361 | 10/1975 | Bove et al. . |
| 4,544,886 | 10/1985 | Murray et al. . |
| 4,544,888 | 10/1985 | Kvaternik . |
| 4,563,640 | 1/1986 | Hasegawa . |
| 4,567,433 | 1/1986 | Ohkubo et al. . |
| 4,585,991 | 4/1986 | Reid et al. . |
| 4,618,820 | 10/1986 | Salvagno et al. . |
| 4,626,776 | 12/1986 | Wilkinson . |
| 4,636,723 | 1/1987 | Coffin . |

*Primary Examiner*—Thomas H. Tarcza
*Assistant Examiner*—Linda J. Wallace

[57] ABSTRACT

A probe head of substantially rectangular construction for use in the testing of chips. The probe head has a body disposed about the perimeter of a substantially transparent fused silica window, probe points extending in a high-density fixed configuration through the fused silica window, and probe leads at one end of which the probe points are formed. The probe leads are disposed in a plurality of layers, such that interior surface, as well as perimeter, probing and testing of chips is facilitated. The probe head also includes a depth-limit plate extending over the edge of the fused silica window and connecting to the probe head body.

4 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH DENSITY PROBE HEAD FOR CHIP TESTING

TECHNICAL FIELD OF THE INVENTION

The present invention relates to probe heads having a plurality of probe points for use in probing interior and perimeter bonding pads of a chip.

BACKGROUND OF THE INVENTION

Current methods of high-volume chip testing utilize complex, large and costly devices which are unreliable in testing some types of chips, most notably high-speed gallium arsenide devices. In addition, prior art probe heads typically probe only the outer perimeter of chips and are unable to test bonding pads located in the internal portion of chips undergoing test. An example of a commonly used fixed probe head for testing integrated circuits can be found in U.S. Pat. No. 4,563,640 to Hasegawa. This type of probe head fixture is typically mounted on an automated testing device which is used for high volume testing of integrated circuits before they are cut from a wafer. The testing procedure is for the probe head to be lowered onto the particular dye to be tested within the wafer, with the probe "fingers" lowered to contact the bonding pads to made electrical connections for testing. The fingers bring out the electrical paths to a test computer or similar machine which applies stimuli to the input pins and records responses on the output pins to determine whether the chip is good. After it has been determined whether the chip is good or bad, the probe head is raised and moved to a new location over another dye on the wafer to be tested. Process is repeated for each dye on the wafer until all of the chips have been tested.

The aforementioned probe heads of the prior art are designed to make electrical contact with a large number of bonding pads corresponding to a large number of I/0 pins and power pins. The manufacture and maintenance of such probe heads is expensive and the probe heads themselves are easily damaged. The probe lead wires from the test computer typically enter in a single planar surface and touch bonding pads that are located on the periphery of he chip to be tested. This design and location of the probe fingers makes for an extremely dense and large probe head since the probes are fixed in a conical radial array corresponding to the periphery of the chip. This radial design necessarily forces the outer diameter of the probe head with the connecting wires to be quite large. Thus, expansion of probe heads to handle a larger number of probe points and to have the ability to probe bonding pads within the internal portion of the chips becomes unwieldy.

The present invention overcomes the above-enumerated problems and other shortcomings associated with current chip testing devices.

BRIEF DESCRIPTION OF THE DRAWINGS

In the drawing, in which like reference numerals indicate corresponding parts throughout the several views.

SUMMARY OF THE INVENTION

Figure 1:
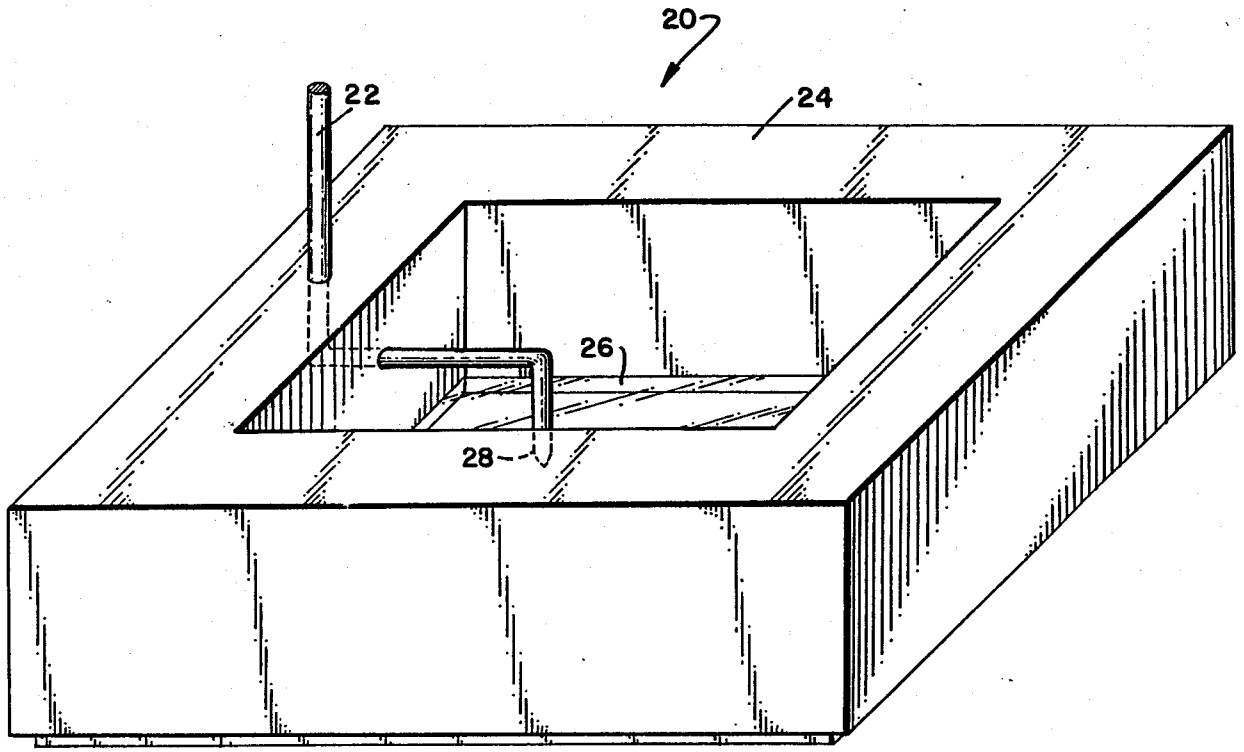
FIG. 1 is a perspective view of an embodiment of a probe head in accordance with the principles of the present invention.

The present invention relates to a probe head of substantially rectangular construction for use in the testing of chips. The probe head has a body disposed about the perimeter of a fused silica window. Probe points extend in a high-density fixed configuration through the fused silica window. These probe points are formed at one end of continuous probe leads, the other ends of which are brought out to either twisted pair or shielded coaxial connections to a test computer which can compare the input stimulus to the output responses to determine the appropriate functioning of the chip. The probe leads are disposed in a plurality of layers, such that interior surface, as well as perimeter, probing and testing of chips is facilitated.

The probe head also includes a depth-limit plate extending over the edge of the fused silica window and connecting to the probe head body. This depth-limit plate prevents the probe points from being deformed due to excess downward pressure during the test process and holds the fused silica window in place.

An advantage of one embodiment of the present invention is that its reduced size in comparison to prior art devices reduces the amount of exposed wire and allows high-speed testing with very little noise or crosstalk between the probe wires, a feature which has good application for gallium arsenide logic.

Another advantage of one embodiment of the present invention is its capacity to be custom-designed to the type of chip being manufactured at a very low cost.

Yet another advantage of one embodiment of the present invention is its capacity for miniaturization, thus allowing compatibility with other miniaturized electrical components.

Still another advantage of one embodiment of the present invention lies in its disposal of probe leads in a plurality of layers, such that interior surface, as well as perimeter, probing and testing of a chip is facilitated.

The above described features and advantages, along with various other advantages and features of novelty, are pointed out with particularity in the claims annexed hereto and formig a part hereof. However, for a better understanding of the invention, its advantages, and objects attained by its use, reference should be had to the drawings which form a further part hereof and to the accompanying descriptive matter in which there is illustrated and described a preferred embodiment of the invention.

DETAILED DESCRIPTION OF THE INVENTION

In the following detailed description of the preferred embodiment, reference is made to accompanying drawings which form a part hereof, and in which is shown by way of illustration a specific embodiment in which the invention may be practiced. This embodiment is described in sufficient detail to enable those skilled in the art to practice the invention and it is to be understood that other embodiments may be utilized and that structural changes may be made without departing from the scope of the present invention. The following detailed description is, therefore, not to be taken in a limiting sense, and the scope of the present invention is defined by the appended claims.

Figure 2:
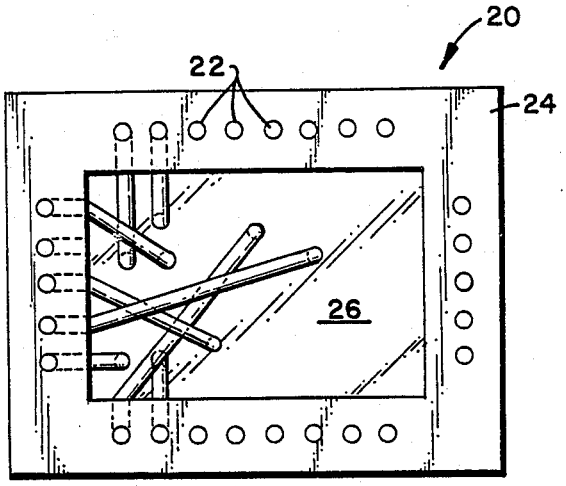
FIG. 2 is a cross-sectional view of the probe head embodiment shown in FIG. 1, viewed from the top.
Figure 3:
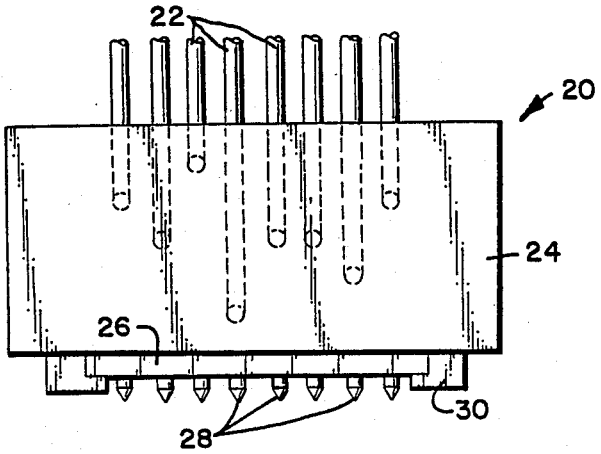
FIG. 3 is a partial side view of the probe head embodiment shown in FIG. 1.
Figure 4:
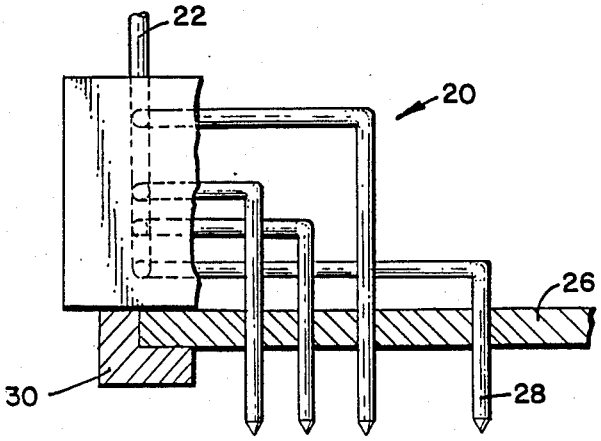
FIG. 4 is a partial cut-away side view of the probe head embodiment shown in FIG. 1.

Referring now to the drawing, there is illustrated in FIGS. 1 through 4 an embodiment of a high-density probe head 20 in accordance with the principles of the present invention. The probe head 20 contains a number of electrically conductive probe leads 22 disposed about the substantially rectangular body 24 of the probe head 20. In the preferred embodiment, said probe leads are very small gold alloy wires. The body 24 is multi-layered and frame-like in construction, forming a rectangular border about a substantially transparent fused silica window 26, through which probe points 28 of the probe leads 22 extend. Those skilled in the art will recognize that any rigid support for the probe leads could be used in place of the fused silica window. Dimensions of the preferred embodiment of the device are very small; the probe head 20 is intended to be 100 mils long, 100 mils wide, and 30 mils deep. The probe leads 22 are intended to be 4 mils in diameter.

The probe leads 22 of the preferred embodiment enter the body 24 in a substantially perpendicular direction to the plane in which the top of the body 24 rests. Each lead 22 may vertically extend, in the preferred embodiment, for example to one of five different levels, at which point it horizontally pierces the body. Each of the leads 22 then extends horizontally through and out the frame-like body 24, such that the lead is disposed in the interior portion of the body, above some point of the fused silica window 26. The lead 22 then drops perpendicularly from its substantially horizontal position, such that it extends through open space in the interior of the body 24 before vertically piercing and extending through the fused silica window 26. The varied paths of individual probe leads 22 are best illustrated by a combination of FIGS. 2, 3 and 4.

The ends 28 of the leads 22 which extend through the fused silica window 26 are disposed at substantially the same distance between the surface of the fused silica window 26 and said ends, hereinafter referred to as probe points 28. The positioning of probe points 28 such that they are disposed over a substantial portion of the fused silica window 26, along with their characteristic as being of substantially similar distance from the surface of the fused silica window 26, facilitates the probing of a chip for test purposes.

Depth control on the apparatus is accomplished through the presence of a depth-limit plate 30 which extends over the edge of the fused silica window 26 and connects to the body 24. This plate 30 prevents the probe points 28 from being deformed due to excess downward pressure during the test process and holds the fused silica window 26 in place.

In use, the probe head 20 is placed into contact with a chip under testing such that each probe point 28 electrically connects to a bonding pad of the chip. The probe leads 22 are brought out to either twisted pair or shielded coaxial connections to a test computer which can compare the input stimulus to the output responses to determine the appropriate functioning of the chip. In this fashion, chips may be tested before they are sliced from the wafer on which they are manufactured, thus reducing the cost of packaging faulty components. In addition, the probe head 20 may possess custom-designed probe points 28 which correspond to a specific type of chip.

While the present invention has been described in connection with the preferred embodiment thereof, it will be understood that many modifications will be readily apparent to those of ordinary skill in the art, and this application is intended to cover any adaptions or variations thereof. Therefore, it is manifestly intended that this invention be limited only by the claims and the equivalents thereof.

What is claimed is:

1. A probe head for testing integrated circuit chips comprising:

a multilayered frame having an outer rigid perimeter and an inner open area;

a plurality of probe points formed at one end of continuous probe leads, said probe leads disposed between a plurality of the layers of said multilayered frame, and said probe points disposed within said inner open area of said frame for contacting the integrated circuit chips.

2. The probe head according to claim 1 further having a probe point support member attached to the lower portion of said frame for supporting said probe points extending below the lower portion of said frame.

3. The probe head according to claim 1 further including a depth limit plate extending around the periphery of said inner open area on the lower portion of said frame operable to prevent said probe points from being deformed due to excess downward pressure during the test process.

4. The probe head according to claim 2 wherein said support member comprises a fused silica window.

* * * * *